United States Patent
Yamazaki et al.

(10) Patent No.: US 7,348,835 B2
(45) Date of Patent: Mar. 25, 2008

(54) MIDPOINT POTENTIAL GENERATING CIRCUIT FOR USE IN A SEMICONDUCTOR DEVICE

(75) Inventors: Masafumi Yamazaki, Kawasaki (JP); Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/802,454

(22) Filed: May 23, 2007

(65) Prior Publication Data

US 2007/0216473 A1    Sep. 20, 2007

Related U.S. Application Data

(62) Division of application No. 11/014,965, filed on Dec. 20, 2004, now Pat. No. 7,224,211.

(30) Foreign Application Priority Data

Aug. 30, 2004    (JP)    ............................. 2004-250627

(51) Int. Cl.
*G05F 1/10*    (2006.01)
*G05F 3/02*    (2006.01)

(52) U.S. Cl. ...................... 327/540; 327/543
(58) Field of Classification Search .................... None
See application file for complete search history.

(56) References Cited

U.S. PATENT DOCUMENTS

| | | | |
|---|---|---|---|
| 4,929,848 A * | 5/1990 | Gulczynski | 327/73 |
| 5,168,174 A * | 12/1992 | Naso et al. | 327/540 |
| 6,034,391 A | 3/2000 | Tobita | |
| 6,741,118 B2 * | 5/2004 | Uchikoba et al. | 327/541 |
| 2001/0022528 A1 | 9/2001 | Houghton et al. | |

FOREIGN PATENT DOCUMENTS

| | | |
|---|---|---|
| JP | 10-12838 | 1/1998 |
| JP | 3399519 | 2/2003 |

* cited by examiner

*Primary Examiner*—Tuan T Lam
(74) *Attorney, Agent, or Firm*—Arent Fox LLP.

(57) ABSTRACT

An object of the invention is to improve a defect caused at the time of starting a midpoint potential generating circuit for use in a semiconductor device. A bias generating circuit supplies a grounding potential as a bias voltage Vbias and sets a midpoint potential of capacitors C1 and C2 to a grounding potential when a supply voltage VDD is lower than a first reference voltage. When the supply voltage VDD is equal to or higher than the first reference voltage, the bias generating circuit supplies the supply voltage VDD as the bias voltage Vbias. When the bias voltage Vbias is equal to or higher than a second reference voltage, the bias generating circuit supplies a voltage obtained by dividing the supply voltage VPP of the booster power supply circuit as the bias voltage Vbias to a node of the capacitors C1 and C2.

3 Claims, 15 Drawing Sheets

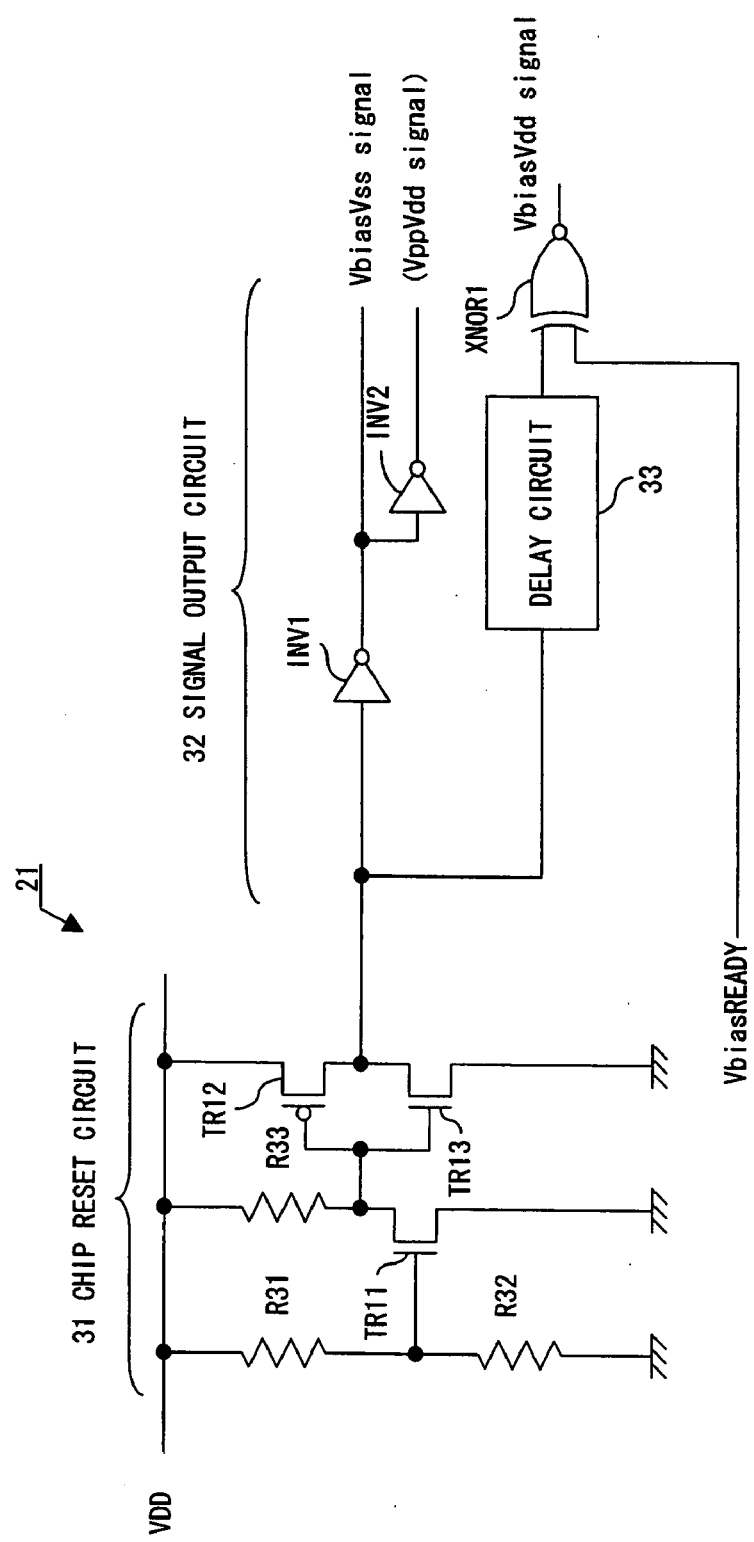
F I G. 5

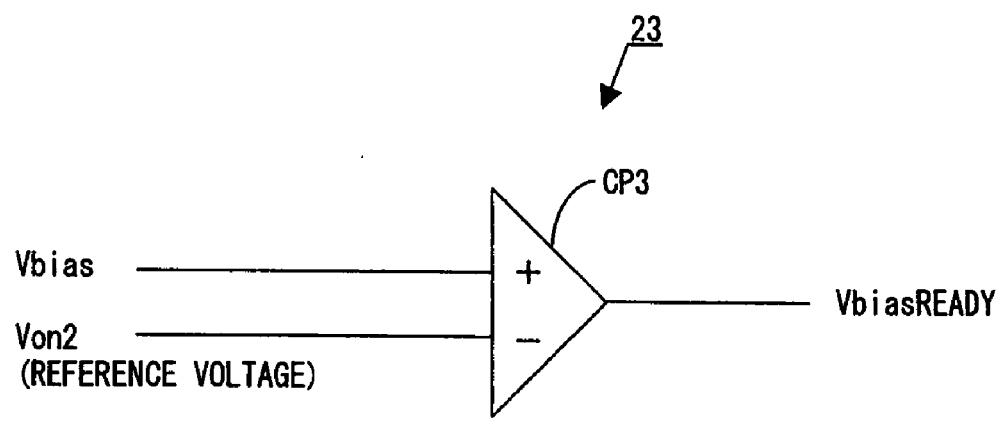
F I G. 6

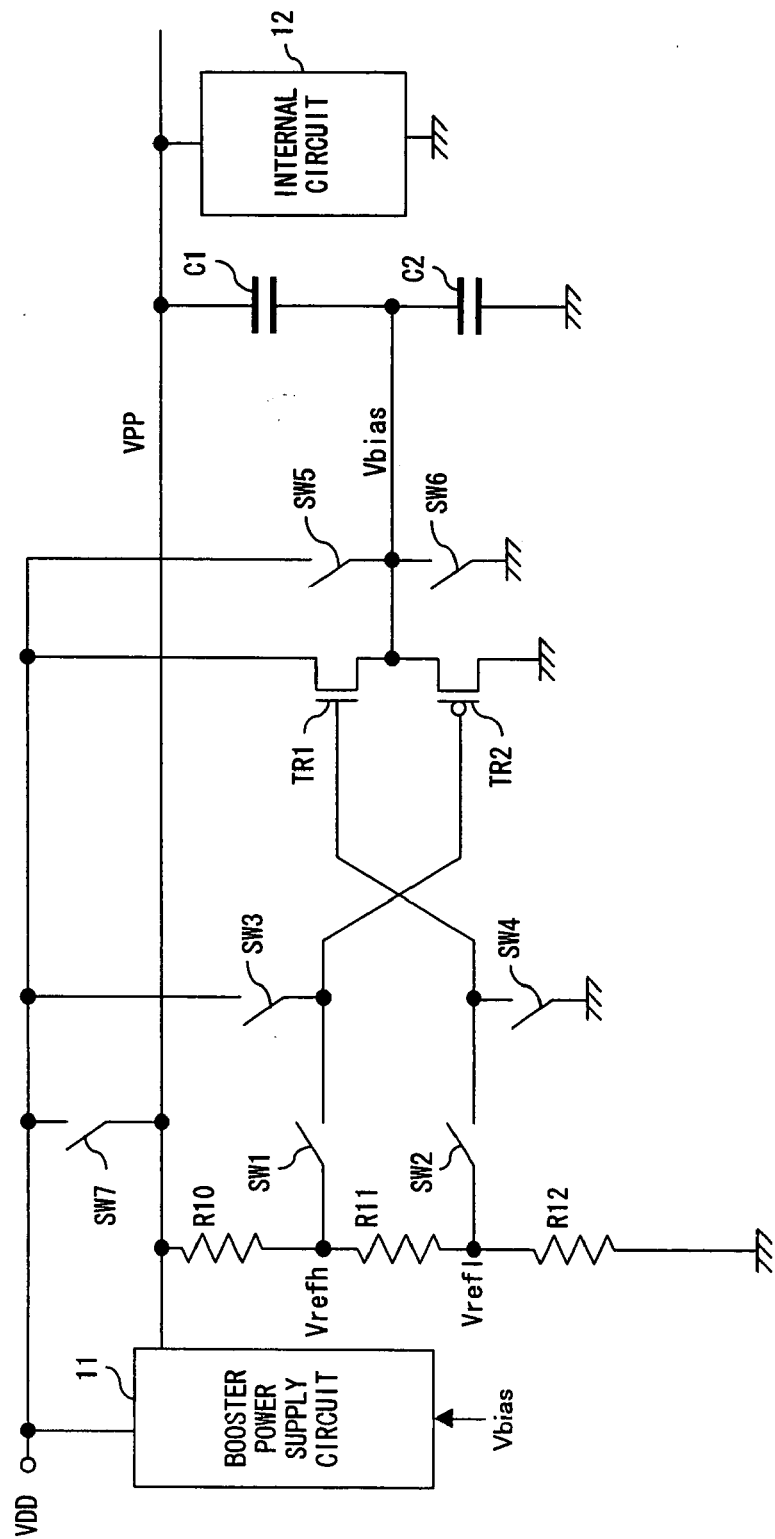
F I G. 7

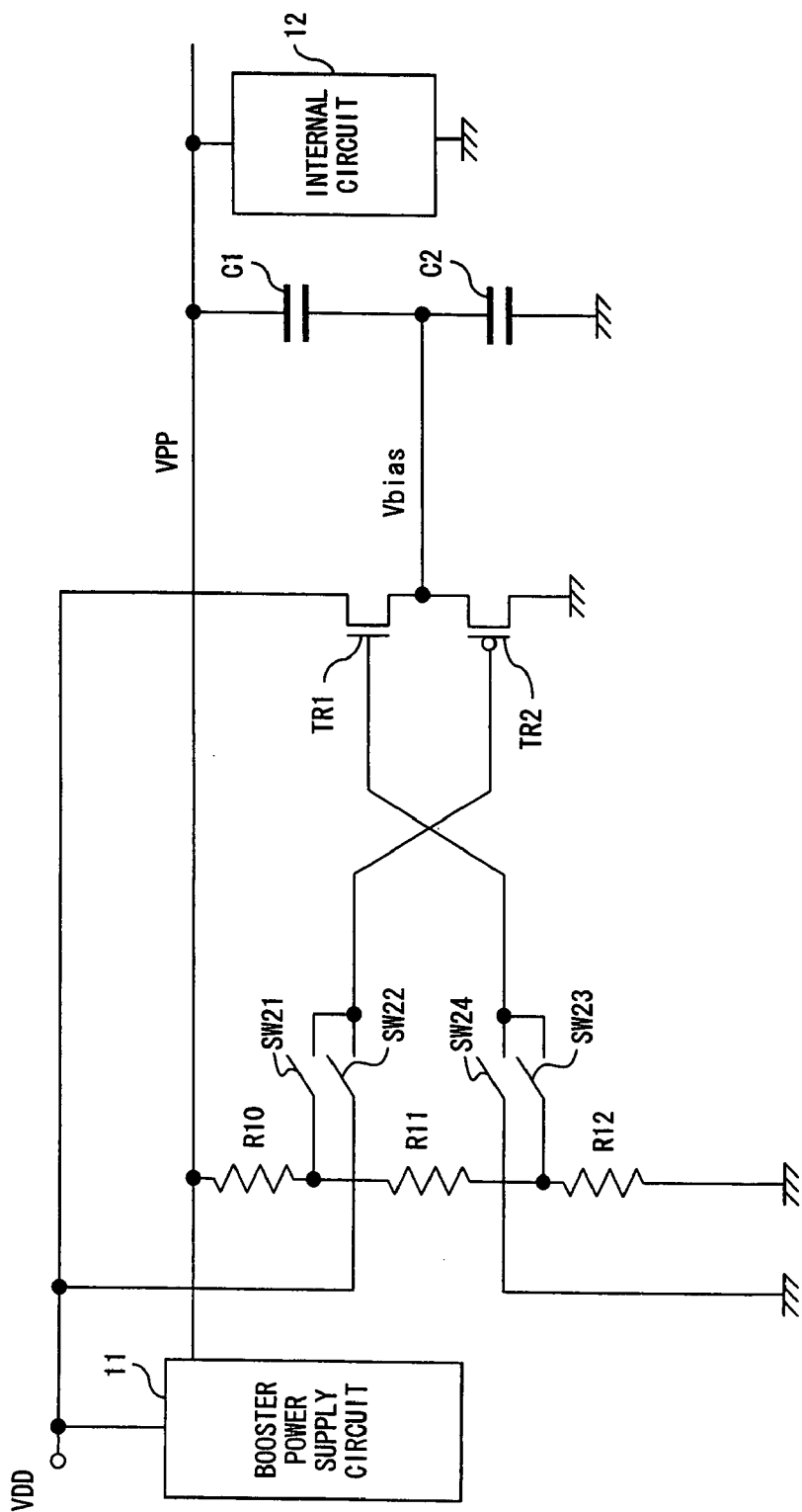
F I G. 14

MIDPOINT POTENTIAL GENERATING CIRCUIT FOR USE IN A SEMICONDUCTOR DEVICE

CROSS-REFERENCE TO RELATED APPLICATIONS

This application is a divisional of U.S. patent application Ser. No. 11/014,965, filed Dec. 20, 2004, now U.S. Pat. No. 7,224,211, which is based upon and claims the benefit of priority from Japanese Patent Application No. 2004-250627, filed on Aug. 30, 2004, the entire contents of which are incorporated herein by reference.

BACKGROUND OF THE INVENTION

1. Field of the Invention

The present invention relates to a midpoint potential generating circuit for use in a semiconductor device.

2. Description of the Related Art

In a semiconductor device such as a DRAM (random access memory), a decoupling capacitor is generally disposed between a power wire and a grounding wire in order to suppress a fluctuation of a supply voltage. There has been proposed that the decoupling capacitor is formed of a stack capacitor used in a memory cell of the DRAM.

For example, JP 10-12838A discloses that a plurality of memory cell capacitors are separately disposed to realize an etendue efficient capacity element.

On the other hand, Japanese Patent 3399519 discloses a bias circuit that supplies a bias voltage to a power supply circuit having an array capacitor with a low voltage limit connected in series as a DRAM power supply.

Meanwhile, in the power supply circuit having the stack capacitors connected in series to realize a large capacity, a circuit that provides a constant midpoint potential to nodes of the capacitors is provided in order that a voltage that is applied to the capacitors does not exceed a limit value.

FIG. 1 is a circuit diagram showing a conventional power supply circuit for a semiconductor device. In FIG. 1, a booster power supply circuit 11 boosts a voltage VDD and generates a supply voltage VPP that is supplied to an internal circuit 12.

Capacitors C1 and C2 are connected in series, the supply voltage VPP is applied to an upper terminal of the capacitor C1, a bias voltage Vbias is applied to a node between the capacitor C1 and the capacitor C2, and a lower terminal of the capacitor C2 is grounded.

An n-channel MOS transistor TR1 and a p-channel MOS transistor TR2 are connected tandem, and a voltage at a node between those transistors TR1 and TR2 is applied to the node of the capacitors C1 and C2 as the bias voltage Vbias.

To a gate of the MOS transistor TR1 is applied a voltage Vrefl developed at a node between resistors R11 and R12 among the resistors R10, R11 and R12 which are connected in series. To a gate of the MOS transistor TR2 is applied a voltage Vrefh developed at a node between the resistors R10 and R11.

Accordingly, when a voltage resulting from adding a threshold voltage Vth of the MOS transistor TR1 to the bias voltage Vbias is lower than a lower limit Vrefl of a voltage that is determined according to the supply voltage VPP outputted from the booster power supply circuit 11 and a resistance ratio of a series resistor consisting of the resistor R10 and the resistor R11 to the resistor R12, the MOS transistor TR1 turns on to charge the capacitor C2.

On the other hand, when a voltage resulting from adding the threshold value Vth of the MOS transistor TR2 to the bias voltage Vbias is higher than an upper limit Vrefh of a voltage that is determined according to a resistance ratio of the resistor R10 to a series resistor consisting of the resistors R11 and R12, the MOS transistor TR2 turns on to discharge the capacitor C2.

The above operation is repeated so that the midpoint potential of the capacitors C1 and C2 is controlled in a range between the upper limit and the lower limit.

FIG. 2 is a circuit that compares the upper limit Vrefh and the lower limit Vrefl of the voltage with the bias voltage Vbias by means of comparators CP1 and CP2 disposed upstream of the MOS transistors TR3 and TR4. In the following description, the same parts as those in FIG. 1 are designated by like references, and their description will be omitted.

In FIG. 2, MOS transistors are connected tandem between the power supply VDD and the ground in such a manner that a p-channel MOS transistor TR3 is disposed at an upper position and an n-channel MOS transistor TR4 is disposed at a lower position.

The lower limit Vrefl of the voltage is inputted to an inverting input terminal of the comparator CP1, and the upper limit Vrefh of the voltage is inputted to an inverting input terminal of the capacitor CP2.

Noninverting input terminals of the comparators CP1 and CP2 are inputted with a voltage obtained by dividing the bias voltage Vbias by resistors R20 and R21.

The operation of this circuit is basically identical with the circuit shown in FIG. 1, and the bias voltage Vbias is controlled in such a manner that the voltage divided by the resistors R20 and R21 falls within a range between the upper limit and the lower limit.

In this example, the operation of starting the midpoint potential generating circuit shown in FIG. 1 will be described with reference to FIG. 3. Normally, the resistors R10, R11 and R12 to be used are large in resistance in order to reduce the power consumption during stationary operation. For that reason, the time constant becomes large, and a given period of time is required until the voltages Vrefh and Vrefl determined according to the divided ratio of the resistors R10, R11, and R12 reach design values at the rising time of the supply voltage.

Under the above circumstances, since the gradient of a potential rising curve of the capacitor C2 is higher than the gradients of the rising curves of the voltages Vrefh and Vrefl (period T1) as shown in FIG. 3, the bias voltage Vbias that is a midpoint potential between the capacitors C1 and C2 may be higher than the upper limit Vrefh of the voltage.

When the bias voltage Vbias becomes higher than the upper limit Vrefh, charges in the capacitor C2 are discharged under the control, and the bias voltage Vbias is decreased (period T2).

Thereafter, when the bias voltage Vbias becomes lower than the lower limit Vrefh, the capacitor C2 restarts to be charged.

As described above, because the capacitor C2 is discharged at the rising time of the supply voltage, there arises such a problem that a time is required until the midpoint potential between the capacitors C1 and C2 reaches a desired voltage.

In addition, in the case where the bias voltage Vbias is decreased after the supply voltage VPP has reached a desired value VPPtarget, the booster power supply circuit 11 charges the capacitor C1 so as to rise in the potential of the capacitor C1. Thereafter, when the bias voltage Vbias rises until the midpoint potential between the capacitors C1 and C2 rises, a voltage across the capacitor C2 becomes higher than a normal voltage. As a result, the voltage VPP across the capacitors C1 and C2 is caused to be higher than the desired voltage VPPtarget (period T4).

In the power supply circuit having a high-capacity capacitor, since a leak current is suppressed, the supply voltage VPP is not immediately decreased.

Since the supply voltage VPP across the capacitors C1 and C2 is applied to an internal circuit of the semiconductor device, the reliability of the internal circuit in the semiconductor device is affected by the supply voltage VPP being too higher than the desired value.

In addition, in the conventional circuit shown in FIGS. 1 and 2, since the booster power supply circuit 11 operates from the starting time, the current consumption increases because the boosting operation is conducted from a state where the supply voltage VDD is low. Accordingly, in the case where the booster power supply circuit 11 is used in a device such as a portable terminal device which is driven by a battery, there arises such a problem that the battery voltage decreases, to thereby make the operation of the system defective.

SUMMARY OF THE INVENTION

In view of the above, an object of the present invention is to improve a defect caused at the time of starting a midpoint potential generating circuit that generates a midpoint potential of capacitors connected in series.

In order to achieve the above object, according to one aspect of the present invention, there is provided a midpoint potential generating circuit for use in a semiconductor device, comprising: a booster power supply circuit that boosts a first supply voltage into a second supply voltage, and supplies the second supply voltage to an internal circuit of the semiconductor device; at least two first and second capacitors that are connected in series; and a bias supply circuit that sets a midpoint potential between the first and second capacitors to a grounding potential or a negative potential at the time of starting the midpoint potential generating circuit, supplies the first supply voltage as the midpoint potential to a node between the first and second capacitors when the first supply voltage is equal to or higher than a first reference voltage, and supplies a predetermined voltage that is obtained from the second supply voltage outputted from the booster power supply circuit as the midpoint potential to the node between the first and second capacitors when the midpoint potential of the node between the first and second capacitors is equal to or higher than a second reference voltage.

In one aspect of the present invention, the midpoint potential of the capacitors can be controlled to a desired appropriate voltage since the supply voltage rises until the supply voltage is stabilized.

According to another aspect of the present invention, there is provided a midpoint potential generating circuit for use in a semiconductor device, comprising: a booster power supply circuit that boosts a first supply voltage into a second supply voltage, and supplies the second supply voltage to an internal circuit of the semiconductor device; at least two first and second capacitors that are connected in series, each of the first and second capacitors having one terminal connected to the second supply voltage and another terminal connected to a grounding potential or a negative potential; and a bias supply circuit that supplies the grounding potential or the negative potential to a node between the first and second capacitors when the first supply voltage is lower than a first reference voltage, supplies the first supply voltage as the midpoint potential to the node between the first and second capacitors when the first supply voltage is equal to or higher than the first reference voltage, and drives the booster power supply circuit and supplies a predetermined voltage that is obtained from the second supply voltage outputted from the booster power supply circuit as the midpoint potential to the node between the first and second capacitors when the midpoint potential of the node between the first and second capacitors is equal to or higher than a second reference voltage.

In another aspect of the present invention, the midpoint potential of the capacitors can be controlled to an appropriate value since the supply voltage rises until the supply voltage is stabilized. Also, the booster power supply circuit is not started until the midpoint potential rises up to a predetermined value. As a result, the supply voltage of a device driven by a battery or the like can be prevented from decreasing due to an increase in the current consumption by the booster power supply circuit that conducts the boosting operation in a state where the supply voltage is low.

In the midpoint potential generating circuit for use in a semiconductor device according to the present invention, the bias supply circuit comprises: a first switch section that connects the node between the first and second capacitors to the grounding potential or the negative potential when the first supply voltage is lower than the first reference voltage; a second switch section that supplies the first supply voltage to power side terminals of the first and second capacitors; a third switch section that supplies the first supply voltage to the node between the first and second capacitors when the first supply voltage is equal to or higher than the first reference voltage; and a bias voltage generating circuit that supplies a predetermined voltage that is obtained from the second supply voltage outputted from the booster power supply circuit to the node between the first and second capacitors when the midpoint potential of the node between the first and second capacitors is equal to or higher than the second reference voltage.

With the above structure, an appropriate midpoint potential can be supplied to the node between the first and second capacitors by changing over the switch sections.

The bias supply circuit of the midpoint potential generating circuit according to the present invention includes: a first judging circuit that judges whether the first supply voltage is equal to or higher than the first reference voltage, or not, outputs a signal that allows the grounding potential or the negative potential to be supplied to the node between the first and second capacitors when the first supply voltage is lower than the first reference voltage, and outputs a signal that allows the first supply voltage to be supplied to the node between the first and second capacitors when the first supply voltage is equal to or higher than the first reference voltage; and a second judging circuit that judges whether the voltage of the node between the first and second capacities is equal to or higher than the second reference voltage, or not, and outputs a signal that allows the predetermined voltage that is obtained from the voltage outputted from the booster power supply circuit to be supplied to the node between the first and second capacitors when the midpoint potential of the node between the first and second capacitors is equal to or higher than the second reference voltage.

With the above structure, it is judged by the first judging circuit whether the first supply voltage is equal to or higher than the first reference voltage, or not, and the potential that is applied to the node between the first and second capacitors can be changed over according to the judgment result. Also, it is judged by the second judging circuit whether the voltage of the node between the first and second capacities is equal to or higher than the second reference voltage, or not, and the predetermined voltage that is obtained from the voltage outputted from the booster power supply circuit can be supplied to the node between the first and second capacitors according to the judgment result.

The bias supply circuit of the midpoint potential generating circuit according to the present invention includes: first and second MOS transistors that are connected tandem between the first supply voltage and the grounding potential or the negative potential; and a fourth switch section that supplies the predetermined voltage obtained from the output voltage of the booster power supply circuit to gates of the first and second MOS transistors when the potential of the node between the first and second capacitors is equal to or higher than the second reference voltage.

The first judging circuit also serves as a reset circuit that stops the operation of the internal circuit when the supply voltage of the semiconductor device is equal to or lower than the predetermined value.

The second reference voltage is equal to a lower limit of the midpoint potential of the node of the capacitors.

The first reference voltage and the second reference voltage are set to about half the second supply voltage.

With the above structure, the midpoint potential between the first and second capacitors can be controlled to about ½ of the second supply voltage.

BRIEF DESCRIPTION OF THE DRAWINGS

These and other objects and advantages of this invention will become more fully apparent from the following detailed description taken with the accompanying drawings in which:

FIG. 5 is a circuit diagram showing a bias control circuit;

FIG. 6 is a circuit diagram showing a bias level detector circuit;

FIG. 7 is a circuit diagram showing a main portion of a midpoint potential generating circuit according to a first embodiment of the present invention;

FIG. 14 is a circuit diagram showing a main portion of a midpoint potential generating circuit according to a sixth embodiment of the present invention.

DESCRIPTION OF THE PREFERRED EMBODIMENTS

Now, a description will be given in more detail of preferred embodiments of the present invention with reference to the accompanying drawings.

Figure 1:
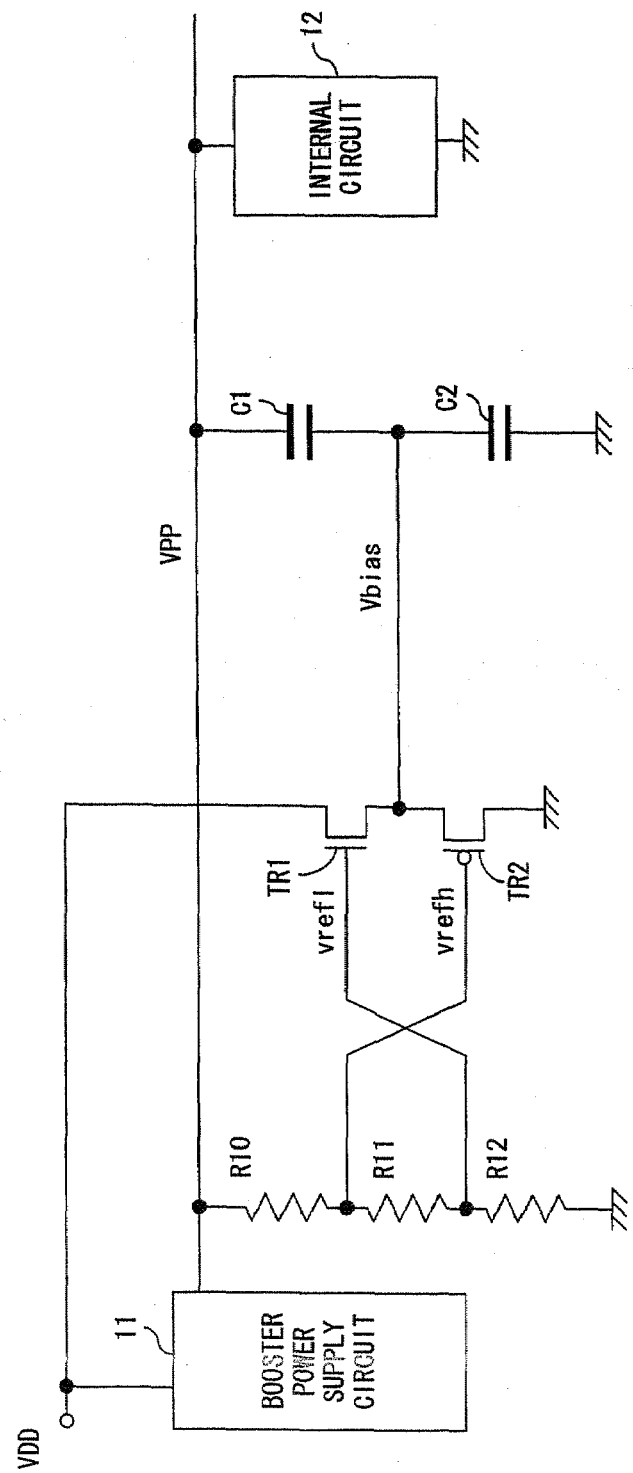
FIG. 1 is a circuit diagram showing one conventional midpoint potential generating circuit.
Figure 4:
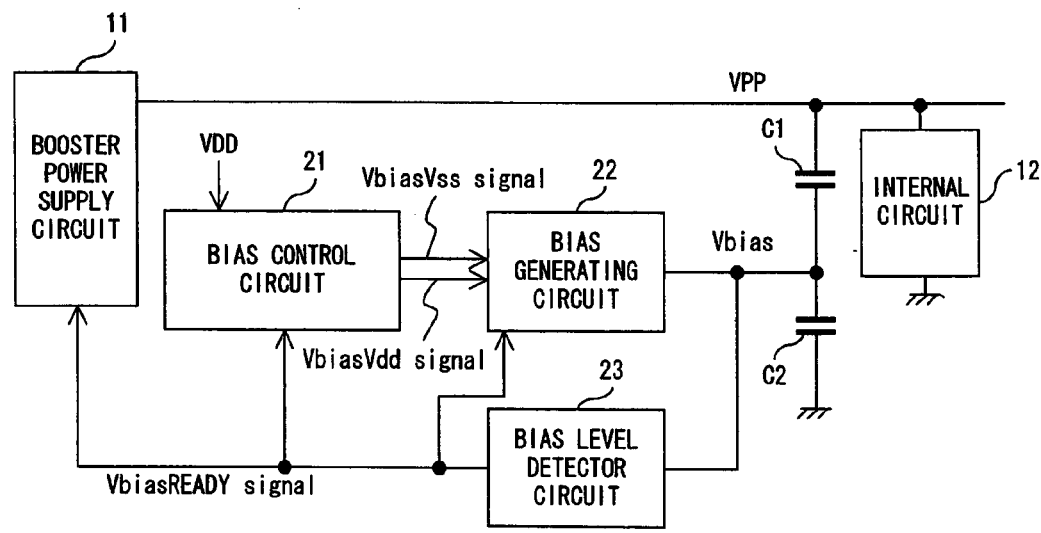
FIG. 4 is a block diagram showing a midpoint potential generating circuit according to an embodiment of the present invention.

FIG. 4 is a circuit diagram showing a midpoint potential generating circuit (power supply circuit) for use in a semiconductor device according to an embodiment of the present invention. In the following description, the same circuit elements as those in the circuit shown in FIG. 1 are designated by like references, and their description will be omitted.

In FIG. 4, a booster power supply circuit 11 boosts a supply voltage VDD (corresponding to a first supply voltage) that is developed in the exterior or interior of a semiconductor device to generate a supply voltage VPP (corresponding to a second supply voltage). The booster power supply circuit 11 is formed of, for example, a booster switching regulator.

Capacitors C1 and C2 are formed of stack capacitors, and the capacitors C1 and C2 are connected in series.

A bias control circuit (corresponding to a first judging circuit) 21 judges whether the supply voltage VDD is equal to or higher than a first reference voltage, or not. When the supply voltage VDD is lower than the first reference voltage, the bias control circuit 21 outputs a signal VbiasVss for supplying a grounding potential or a negative potential to a node of the capacitors C1 and C2. Also, when the supply voltage VDD is equal to or higher than the first reference voltage, the bias control circuit 21 outputs to a bias generating circuit 22, a signal VbiasVdd for supplying the supply voltage VDD as a midpoint potential to a node of the capacitors C1 and C2.

When the supply voltage VDD is lower than the first reference voltage, the bias generating circuit 22 supplies the grounding potential as the bias voltage Vbias, and sets the midpoint potential between the capacitors C1 and C2 to the grounding potential. Also, when the supply voltage VDD is equal to or higher than the first reference voltage, the bias generating circuit 22 supplies the supply voltage VDD as the bias voltage Vbias.

A bias level detector circuit (corresponding to a second judging circuit) 23 detects a voltage level of the bias voltage Vbias. When the bias level detector circuit 23 detects that the bias voltage Vbias is equal to or higher than a second reference voltage, the bias level detector circuit 23 outputs a signal VbiasREADY to the booster power supply circuit 11 to start the booster power supply circuit 11, and outputs the signal VbiasREADY to the bias generating circuit 22.

Upon receiving the active signal VbiasREADY, the bias generating circuit 22 supplies a predetermined voltage that is obtained by dividing the supply voltage VPP outputted from the booster supply voltage circuit 11 to the node of the capacitors C1 and C2.

The bias control circuit 21, the bias generating circuit 22 and the bias level detector circuit 23 correspond to a bias supply circuit.

FIG. 5 is a circuit diagram of the bias control circuit 21. The bias control circuit 21 is made up of a chip reset circuit (starter circuit) 31 that judges whether the supply voltage VDD is equal to or higher than a reference voltage Von1 (corresponding to the first reference voltage) at the start time, or not, and a signal output circuit 32 that outputs the signal VbiasVss and the signal VbiasVdd which are a predetermined level on the basis of the judgment result of the chip reset circuit 31.

The chip reset circuit 31 includes resistors R31 and R32 that are connected in series between the power supply VDD and the ground, an n-channel MOS transistor TR11, a resistor R33 that is connected between the power supply VDD and a drain of the MOS transistor TR11, and a p-channel MOS transistor TR12 and an n-channel MOS transistor TR13 which are connected tandem between the power supply VDD and the ground and whose gates are connected to each other.

The signal output circuit 32 includes an inverter INV1 that is connected to a node between the MOS transistors TR12 and TR13, a delay circuit 33, an inverter INV2 that is connected to an output of the inverter INV1, and an XNOR gate XNOR1 takes the negation of an exclusive OR of the signal VbiasREADY and an output signal of the delay circuit 33.

In the bias control circuit 21 of FIG. 5, when a voltage obtained by dividing the supply voltage VDD by the resistors R31 and R32 is lower than a threshold voltage of the MOS transistor TR11, the MOS transistor TR11 turns off, the MOS transistor TR13 turns on, and the input voltage level of the inverter INV1 becomes a grounding potential level. Accordingly, the signal VbiasVss that is an output signal of the inverter INV1 becomes the supply voltage VDD level.

In this situation, the voltage level of the signal VppVdd which is the output signal of the inverter INV2 becomes the grounding potential. The signal VppVdd is a signal that is supplied to a level converter circuit 41 that will be described later.

In this situation, the output signal of the XNOR gate XNOR1 becomes the supply voltage VDD level since the input signal of the delay circuit 33 is of the grounding potential level and the signal VbiasREADY that will be described later is of the grounding potential level.

Then, when the voltage obtained by dividing the supply voltage VDD by the resistors R31 and R32 is equal to or higher than the threshold voltage of the MOS transistor TR11, the MOS transistor TR11 turns on, the MOS transistor TR12 turns on, and the signal VbiasVss becomes the grounding potential level. When the voltage obtained by dividing the supply voltage VDD by the resistors R31 and R32 is equal to the threshold voltage of the MOS transistor TR11, the voltage corresponds to the reference voltage Von1 (first reference voltage).

When the MOS transistor TR12 turns on, the MOS transistor TR13 turns off, and the potential of the node between the MOS transistors TR12 and TR13 becomes the supply voltage VDD level, a signal of the supply voltage VDD level is outputted from the delay circuit 33 after a delay time has elapsed. As a result, the signal VbiasVdd of the grounding potential level is outputted from the XNOR gate XNOR1.

That is, when the supply voltage VDD is lower than the reference voltage Von1, the bias control circuit 21 outputs the signal VbiasVdd of the grounding potential level and the signal VbiasVdd of the supply voltage VDD level. Then, when the supply voltage VDD is equal to or higher than the reference voltage Von1, the bias control circuit 21 outputs the signal VbiasVss of the supply voltage VDD level and the signal VbiasVdd of the grounding potential level.

Subsequently, FIG. 6 is a circuit diagram of the bias level detector circuit 23. The bias level detector circuit 23 is made up of, for example, a comparator CP3 having a noninverting input terminal to which the bias voltage Vbias of the node of the capacitors C1 and C2 is inputted, and an inverting input terminal to which a reference voltage Von2 is inputted.

When the bias voltage Vbias is lower than the reference voltage Von2 (second reference voltage), the bias level detector circuit 23 outputs the signal VbiasREADY of the grounding potential level to the booster power supply circuit 11 and the bias generating circuit 22. When the bias voltage Vbias is equal to or higher than the reference voltage Von2, the bias level detector circuit 23 outputs the signal Vbias-READY of the supply voltage VDD level to the booster power supply circuit 11 and the bias generating circuit 22.

Now, the operation of the midpoint potential generating circuit shown in FIG. 4 will be described again. When the supply voltage VDD is lower than the reference value Von1, and the signal VbiasVss is of the supply voltage VDD level, the bias generating circuit 22 sets the node of the capacitors C1 and C2 to the grounding potential.

When the supply voltage VDD rises up to the reference voltage Von1 or higher, and the signal VbiasVss changes to the grounding potential level, the bias generating circuit 22 separates the node of the capacitors C1 and C2 from the grounding potential, and supplies the supply voltage VDD to the node of the capacitors C1 and C2 after a predetermined delay time has elapsed.

After the supply of the supply voltage VDD to the node of the capacitors C1 and C2 starts, the bias voltage Vbias rises. When the bias voltage Vbias is equal to or higher than the reference potential Von2, the bias level detector circuit 23 outputs the signal VbiasREADY of the supply voltage VDD level.

When the signal VbiasREADY that is outputted from the bias level detector circuit 23 becomes the supply voltage VDD level, the booster power supply circuit 11 starts and outputs the voltage VPP obtained by boosting the supply voltage VDD at that time to the bias generating circuit 22. The bias generating circuit 22 supplies a predetermined voltage (about ½ voltage of VPP) obtained by dividing the output voltage VPP of the booster power supply circuit 11 to the node of the capacitors C1 and C2 as the midpoint potential. As a result, the potential of the node of the capacitors C1 and C2 is set to about ½ voltage of the supply voltage VPP.

FIG. 7 is a circuit diagram showing a main portion of a midpoint potential generating circuit according to a first embodiment of the present invention.

The supply voltage VPP outputted from the booster power supply circuit 11 is supplied to one end of the resistor R10, the power supply side terminal of the capacitor C1, and the internal circuit 12.

The voltage Vrefh of the node between the resistors R10 and R11 is inputted to the gate of the p-channel MOS transistor TR2 through a switch SW1. Also, the voltage Vrefl of the node between the resistors R11 and R12 is inputted to the gate of the n-channel MOS transistor TR1 through a switch SW2.

The switches SW1 and SW2 turn on when the signal ViasREADY is of the supply voltage VDD level. Those switches SW1 and SW2 are realized by MOS transistors, or a transfer gate having a p-channel MOS transistor and an n-channel MOS transistor connected in parallel.

A switch SW3 is connected between the gate of the MOS transistor TR2 and the supply voltage VDD, and a switch SW4 is connected between the gate of the MOS transistor TR1 and the ground.

The switches SW3 and SW4 turn on when the signal VbiasREADY is of the grounding potential level.

That is, when the bias voltage Vbias is lower than the reference voltage Von2, the switches SW3 and SW4 turn on, the gate of the MOS transistor TR2 is connected to the supply voltage VDD, the gate of the MOS transistor TR1 is grounded, and both of the MOS transistors TR1 and TR2 become off.

A switch SW5 is connected between the node of the capacitors C1 and C2 and the supply voltage VDD, and a switch SW6 is connected between the node of the capacitors C1 and C2 and the ground. Also, a switch SW7 is connected between the power supply VPP that is the output voltage of the booster power supply circuit 11 and the supply voltage VDD.

The switch SW6 turns on when the signal VbiasVss is of the supply voltage VDD level, and turns off when the signal VbiasVss is of the grounding potential level. Also, the switch SW5 turns off when the signal VbiasVdd is of the supply voltage VDD level, and turns on when the signal VbiasVdd is of the grounding potential level.

That is, when the supply voltage VDD is lower than the first reference voltage (Von1), the switch SW6 turns on, and the node of the capacitors C1 and C2 is grounded. When the supply voltage VDD is equal to or higher than the first reference voltage, the switch SW6 turns off. After a predetermined delay time has elapsed, the switch SW5 turns on, and the supply voltage VDD is applied to the node of the capacitors C1 and C2.

In addition, when the potential of the node of the capacitors C1 and C2 is equal to or higher than the second reference voltage (Von2), the switches SW1 and SW2 turn on, and the switches SW3 and SW4 turn off. As a result, the voltage of the node of the capacitors C1 and C2 falls within a range of from the upper limit Vrefh and the lower limit Vrefl of the voltage obtained by dividing the output voltage VPP of the booster power supply circuit 11 by the resistors, R10, R11 and R12 under the control.

Figure 8:
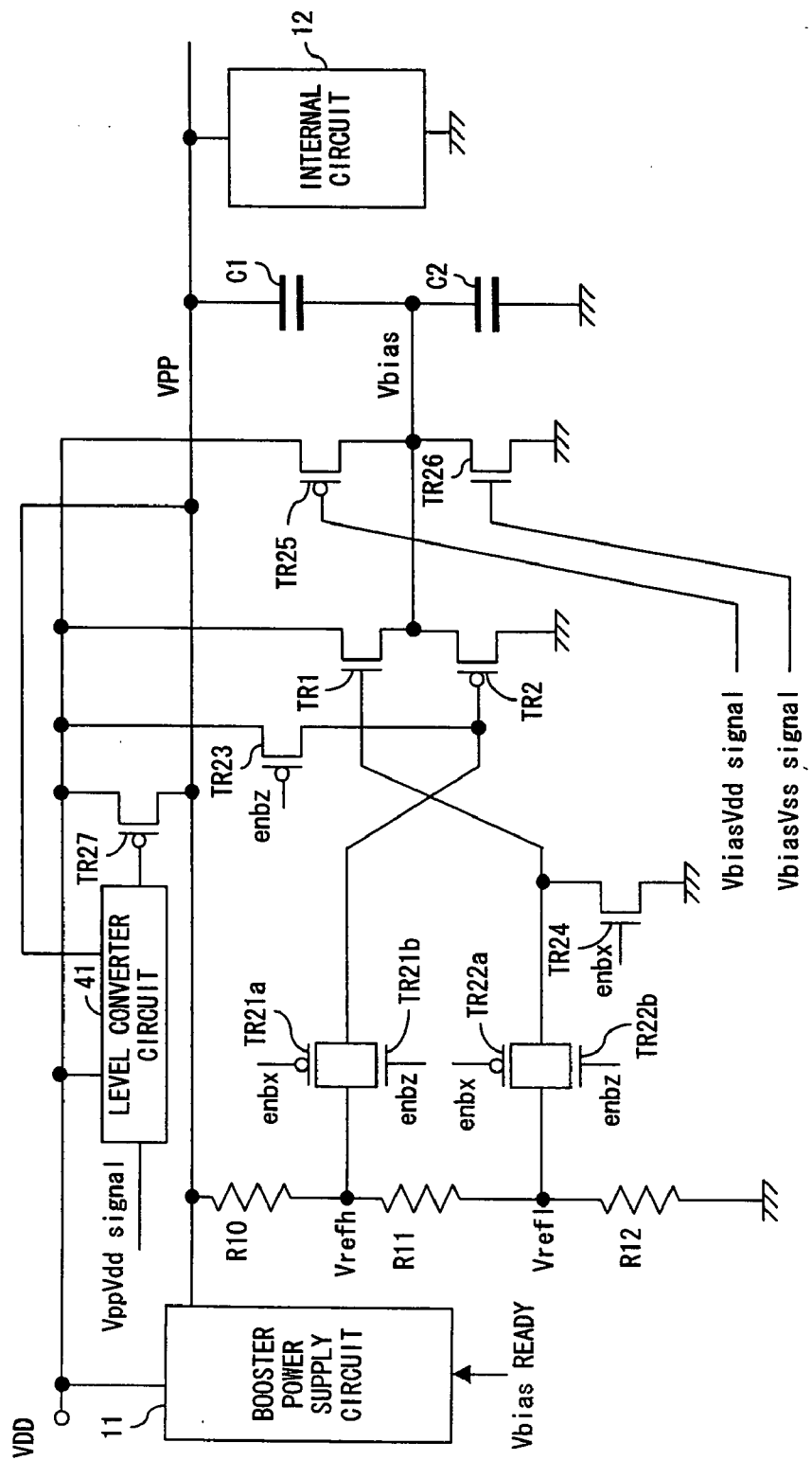
FIG. 8 is a circuit diagram showing a main portion of a midpoint potential generating circuit according to a second embodiment of the present invention.

FIG. 8 is a circuit diagram showing a main portion of a midpoint potential generating circuit according to a second embodiment of the present invention. In the second embodiment, the respective switches in FIG. 7 are replaced by MOS transistors or transfer gates.

The voltage Vrefh of the node of the resistors R10 and R11 is applied to a gate of the MOS transistor TR2 through a transfer gate 21 having a p-channel MOS transistor TR21a and an n-channel MOS transistor TR21b connected in parallel (hereinafter, two MOS transistors connected in parallel are generally named "transfer gate").

The voltage Vrefl of the node of the resistors R11 and R12 is applied to a gate of the MOS transistor TR1 through a transfer gate 22 having a p-channel MOS transistor TR22a and an n-channel MOS transistor TR22b connected in parallel.

A gate of the MOS transistor TR2 is connected to the supply voltage VDD through a p-channel MOS TR23, and a gate of the MOS transistor TR23 is supplied with a signal enbz (a signal identical with the signal VbiasREADY).

A gate of the MOS transistor TR1 is grounded through an n-channel MOS TR24, and a gate of the MOS transistor TR24 is supplied with a signal enbx (a signal that inverts the signal VbiasREADY).

The node of the capacitors C1 and C2 is connected to the power supply VDD through a p-channel MOS transistor TR25, and a gate of the p-channel MOS transistor TR25 is supplied with the signal VbiasVdd.

The node of the capacitors C1 and C2 is grounded through an n-channel MOS transistor TR26, and a gate of the n-channel MOS transistor TR26 is supplied with the signal VbiasVss.

In addition, the output voltage VPP of the booster power supply circuit 11 is connected to the supply voltage VDD through a p-channel MOS transistor TR27, and a gate of the p-channel MOS transistor TR27 is connected with the level converter circuit 41.

The level converter circuit 41 converts a voltage level that is applied to the gate of the p-channel MOS transistor TR27. Since the maximum level of a signal VppVdd that is outputted from the bias control circuit 21 is the supply voltage VDD level, the level converter circuit 41 converts the output voltage into the supply voltage VPP level and then supplies the supply voltage VPP level to the gate of the MOS transistor TR27. With this operation, the p-channel MOS transistor TR27 can turn off when the supply voltage VPP becomes higher than the supply voltage VDD.

The operation of the circuit shown in FIG. 8 will be described with reference to a timing chart shown in FIG. 9.

First, the operation of the circuit at a time 0 to a time t1 (period T1) will be described. When the semiconductor device starts from a state in which the supply voltage VDD is 0 V, it is detected by the chip reset circuit 31 of the bias control circuit 21 that the supply voltage VDD is lower than the reference voltage Von1. Therefore, the signal VbiasVss of the supply voltage VDD level, the signal VppVdd of the grounding potential level, and the signal VbiasVdd of the supply voltage VDD level are outputted from the signal output circuit 32.

In this situation, since the capacitor C2 has not yet been charged, the bias voltage Vbias that is the voltage of the node of the capacitors C1 and C2 is also lower than the reference voltage Von2. Accordingly, in this situation, the signal VbiasREADY of the grounding potential level is outputted from the bias level detector circuit 23.

In this example, the reference voltage Von1 and the reference voltage Von2 are set to about ½ voltage of the supply voltage VPP. The reference voltage Von1 and the reference voltage Von2 may not be identical with each other, but may be different from each other.

The signal biasREADY and its inverting signal are provided as the signal enbz and the signal enbx for turning on or off the transfer gates TR21 and TR22 shown in FIG. 8.

In this case, the signal enbz of the grounding potential level is supplied to the gate of the n-channel MOS transistor TR21b shown in FIG. 8, and the signal enbx of the supply voltage VDD level is supplied to the gate of the p-channel MOS transistor TR21a shown in FIG. 8. As a result, both of the MOS transistor TR21b and TR21a become off.

Likewise, the signal enbz of the grounding potential level is supplied to the gate of the n-channel MOS transistor TR22b, and the signal enbx of the supply voltage VDD level is supplied to the gate of the p-channel MOS transistor TR22a. As a result, both of the MOS transistor TR22a and TR22b become off.

With the above operation, the gates of the MOS transistors TR1 and TR2 are separated from the booster power supply circuit 11.

In this situation, since the signal enbz of the grounding potential level is supplied to the gate of the MOS transistor TR23, the MOS transistor TR23 becomes on. As a result, the gate voltage of the MOS transistor TR2 is decided to the supply voltage VDD level.

Also, since the signal enbx of the supply voltage VDD level is supplied to the gate of the MOS transistor TR24, the MOS transistor TR24 becomes on. As a result, the gate voltage of the MOS transistor TR1 is decided to the grounding potential level.

Furthermore, since the signal VbiasVdd and the signal VbiasVss become the supply voltage VDD level, the MOS transistor TR25 turns off, the MOS transistor TR26 turns on, and the node of the capacitors C1 and C2 is grounded. In this situation, the signal VppVdd becomes the grounding level, and since the transistor TR27 turns on, the capacitor C1 is charged by the supply voltage VDD.

Figure 9:
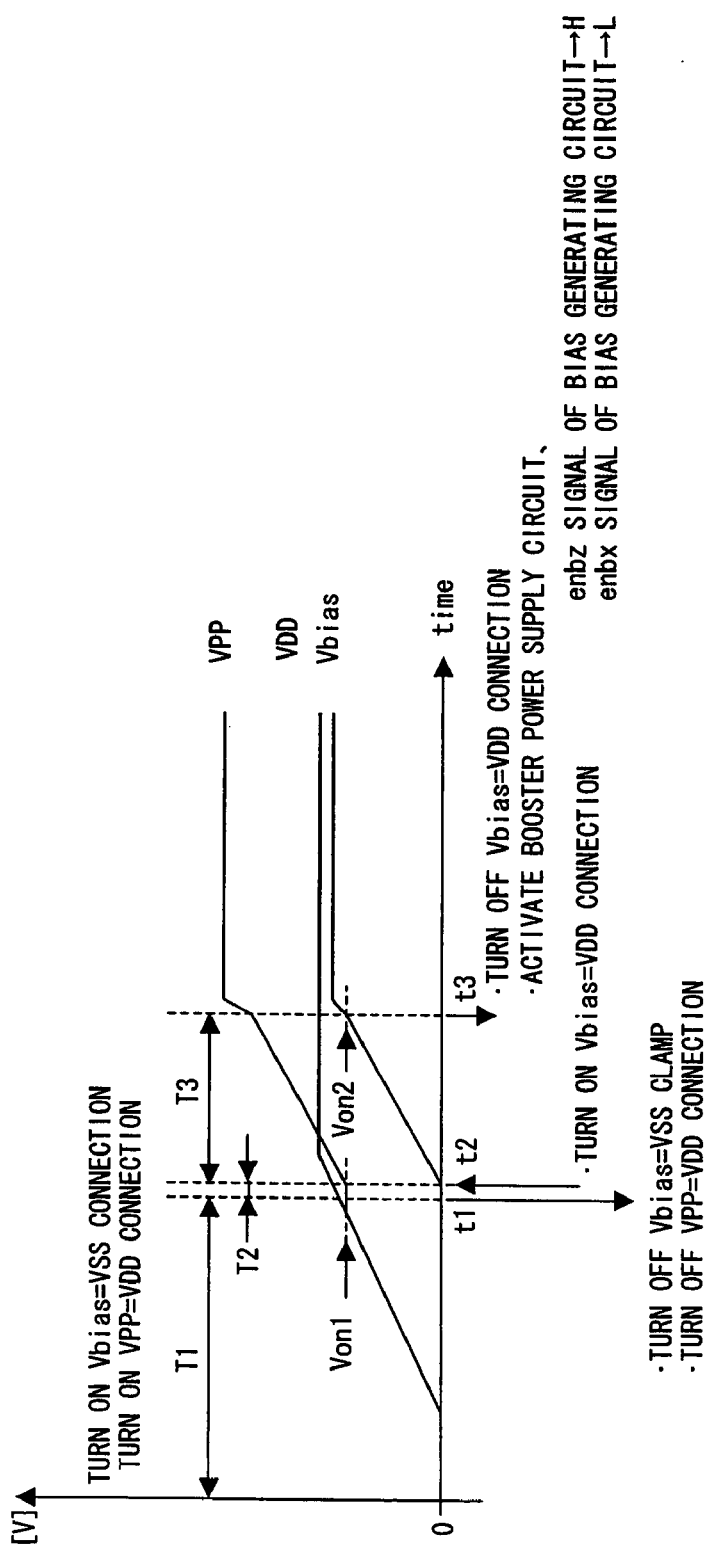
FIG. 9 is a timing chart of the midpoint potential generating circuit according to the second embodiment.

Accordingly, in a period T1 of FIG. 9 where the supply voltage VDD is lower than the reference voltage Von1, the node of the capacitors C1 and C2 is grounded, and the supply voltage VDD is applied to the power supply side terminal of the capacitor C1.

Subsequently, the operation of the circuit at the times t1 to t2 (period T2) in FIG. 9 will be described.

When the supply voltage VDD rises, and it is detected by the chip reset circuit 31 that the supply voltage is equal to or higher than the reference voltage Von1, the signal VbiasVss of the grounding potential level and the signal VppVdd of the supply voltage VDD level are outputted from the signal output circuit 32 (time t1 in FIG. 9). As a result, the MOS transistor TR26 becomes off, and the node of the capacitors C1 and C2 is disconnected from the ground.

After the delay time of the delay circuit 33 has elapsed (time t2), when the signal VbiasVdd of the grounding potential level is outputted, the MOS transistor TR25 becomes on, and the supply voltage VDD is applied to the node of the capacitors C1 and C2. In this situation, since the capacitor C2 has not yet been charged and the bias voltage Vbias is lower than the reference voltage Von2, the signal VbiasREADY remains the grounding potential level.

With the above operation, the capacitor C2 is charged by the supply voltage VDD, and the midpoint of the node of the capacitors C1 and C2 gradually rises up to the supply voltage VDD.

Subsequently, the operation of the circuit at the times t2 to t3 (period T3) will be described.

When the potential of the capacitor C2 rises, and it is judged by the bias level detector circuit 23 that the bias voltage Vbias is equal to or higher than the reference voltage Von2, the signal VbiasREADY of the supply voltage VDD level is outputted from the bias level detector circuit 23.

At the time t3, when the signal VbiasREADY signal changes to the supply voltage VDD level, the booster power supply circuit 11 is started according to the signal VbiasREADY. At the same time, the signal VbiasVdd becomes the supply voltage VDD level, the MOS transistor TR25 becomes off, and the node of the capacitors C1 and C2 is separated from the supply voltage VDD.

When the signal VbiasREADY is of the supply voltage VDD level, the signal enbz becomes the supply voltage VDD level and the signal enbx becomes the grounding potential level. Therefore, the MOS transistors TR21a and TR21b become on. Similarly, the MOS transistors TR22a and TR22b become on. In this situation, the MOS transistors TR23 and TR24 become off.

The supply voltage VPP that has been boosted by the booster power supply circuit 11 and the voltage Vrefh determined by the voltage division ratio of the resistor R10 to a series combined resistor of the resistors R11 and R12 are applied to the gate of the MOS transistor TR2. At the same time, the supply voltage VPP and the voltage Vrefl determined by the voltage division ratio of a series combined resistor of the resistors R10 and R11 to the resistor R12 are applied to the gate of the MOS transistor TR1.

With the above operation, the bias voltage Vbias of the node of the capacitors C1 and C2 is so controlled as to fall within a range of from the lower value Vrefl to the upper value Vrefh by means of the MOS transistors TR1 and TR2.

In the above-mentioned midpoint potential generating circuit according to the second embodiment, in the case where the power supply of the semiconductor device starts from 0 V, when the supply voltage VDD is lower than the reference voltage Von1, the midpoint potential of the two capacitors C1 and C2 connected in series is set to the grounding potential (or negative potential). Thereafter, at the time when the supply voltage VDD reaches the reference voltage Von1, the supply voltage VDD is applied to the midpoint potential of the capacitors C1 and C2. Then, at the time when the midpoint potential of the capacitors C1 and C2 reaches the reference voltage Von2, the booster power supply circuit 11 starts, and a predetermined voltage developed from the supply voltage VPP that has been boosted by the booster power supply circuit 11 is applied as the midpoint potential of the capacitors C1 and C2.

According to the above second embodiment, even in the case of using the high-resistant resistors R10, R11 and R12, the midpoint potential of the capacitors C1 and C2 at the time of starting the power supply can fall within a desired voltage range under the control. As a result, the voltage VPP across the two capacitors C1 and C2 connected in series can be prevented from getting equal to or higher than a specific value. In addition, when the bias voltage Vbias is lower than the reference voltage Von2, since the booster power supply circuit 11 is not made to operate, the booster power supply circuit 11 can be prevented from operating in a state where the supply voltage is low, which causes an increase in the power consumption. As a result, the battery voltage of the device that is driven by a battery or the like can be prevented from temporarily decreasing which causes a failure in the operation.

Figure 10:
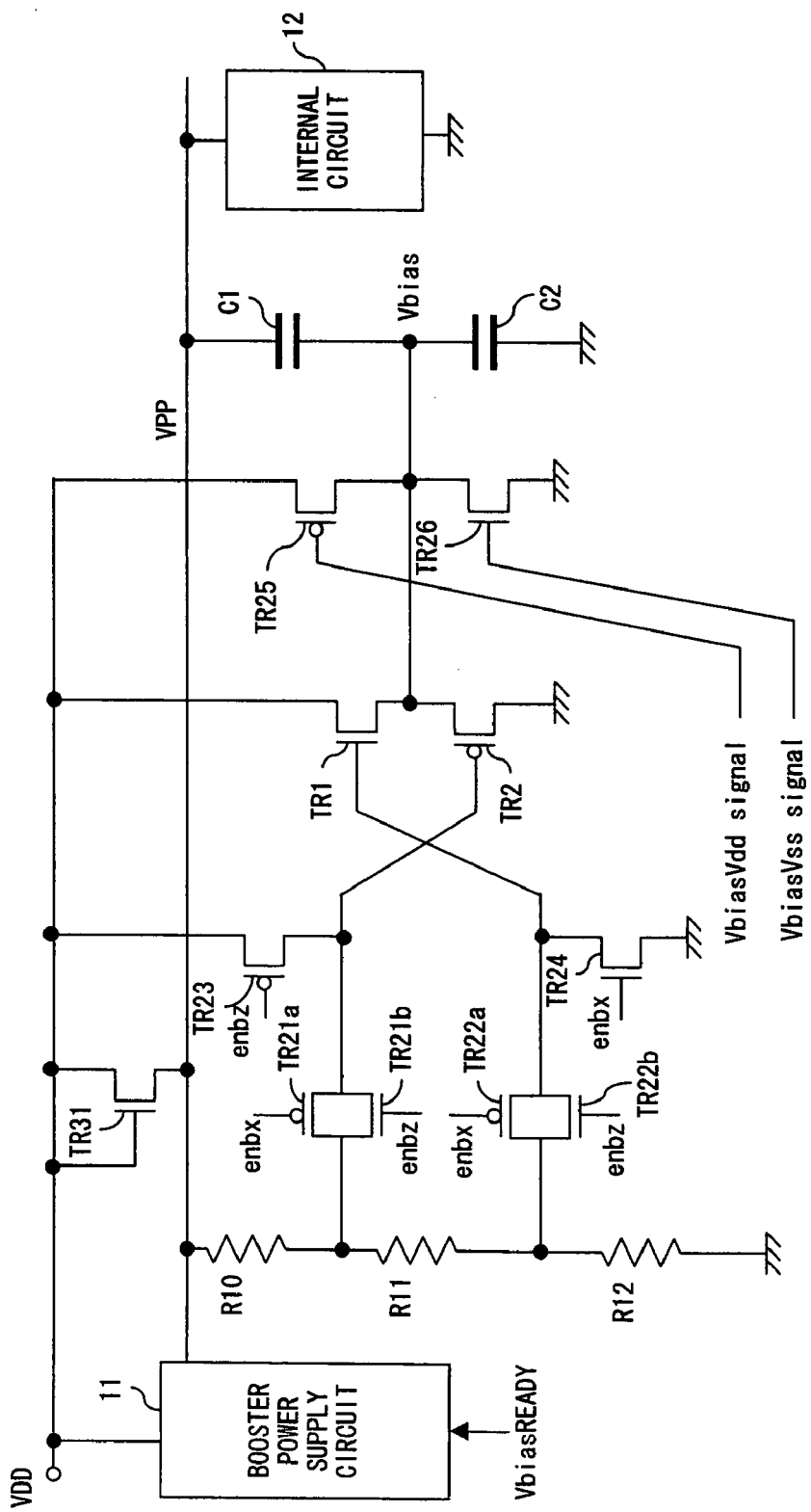
FIG. 10 is a circuit diagram showing a main portion of a midpoint potential generating circuit according to a third embodiment of the present invention.

FIG. 10 is a circuit diagram showing a midpoint potential generating circuit according to a third embodiment of the present invention. In the third embodiment, the p-channel MOS transistor TR27 in the circuit shown in FIG. 9 is replaced by an n-channel MOS transistor TR31. Hereinafter, parts different from those in the circuit of FIG. 9 will be described.

The n-channel MOS transistor TR31 has a gate and a drain connected to the supply voltage VDD, and the MOS transistor TR31 equivalently functions as a diode.

Accordingly, in a state where the booster power supply circuit 11 does not start, the supply voltage VDD is applied to a power wire of the supply voltage VPP through the MOS transistor TR31. When the booster power supply circuit 11 starts, and a value of the supply voltage VPP becomes equal to or higher than the supply voltage VDD, the MOS transistor TR31 becomes off.

Figure 11:
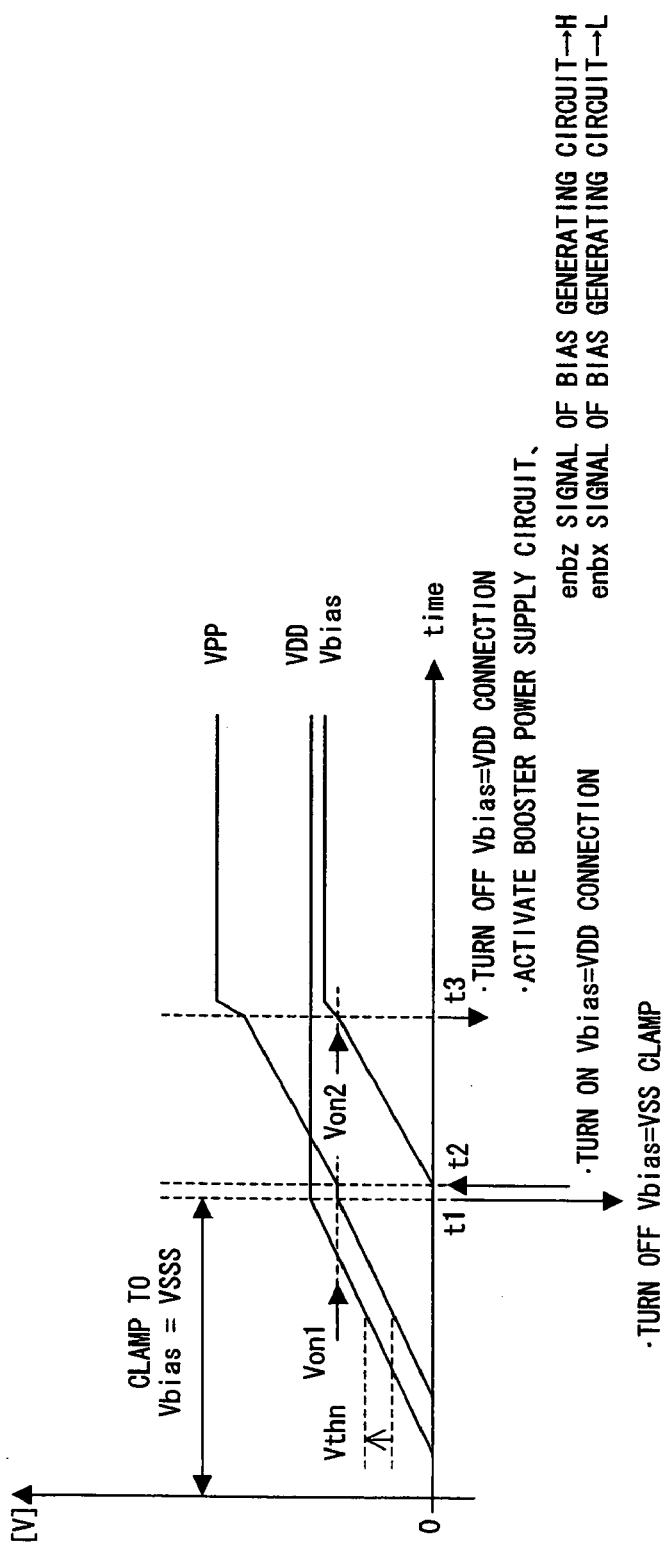
FIG. 11 is a timing chart of the midpoint potential generating circuit according to the third embodiment.

The operation of the circuit shown in FIG. 10 will be described with reference to a flowchart of FIG. 11. When the supply voltage VDD is lower than the reference voltage Von1, the MOS transistor TR31 becomes on, and the supply voltage VDD is applied to the power supply side terminal of the capacitor C1 and the internal circuit 12. In this case, the supply voltage VPP is lower than the supply voltage VDD as much as the threshold voltage Vthn of the MOS transistor TR31. The other operation is identical with that of the above-mentioned circuit operation of FIG. 8.

According to the third embodiment, in addition to the advantages of the above-mentioned second embodiment, the circuit construction can be more simplified since there is required no level converter circuit 41 for converting the voltage level that is applied to the gate of the p-channel MOS transistor TR27.

Figure 12:
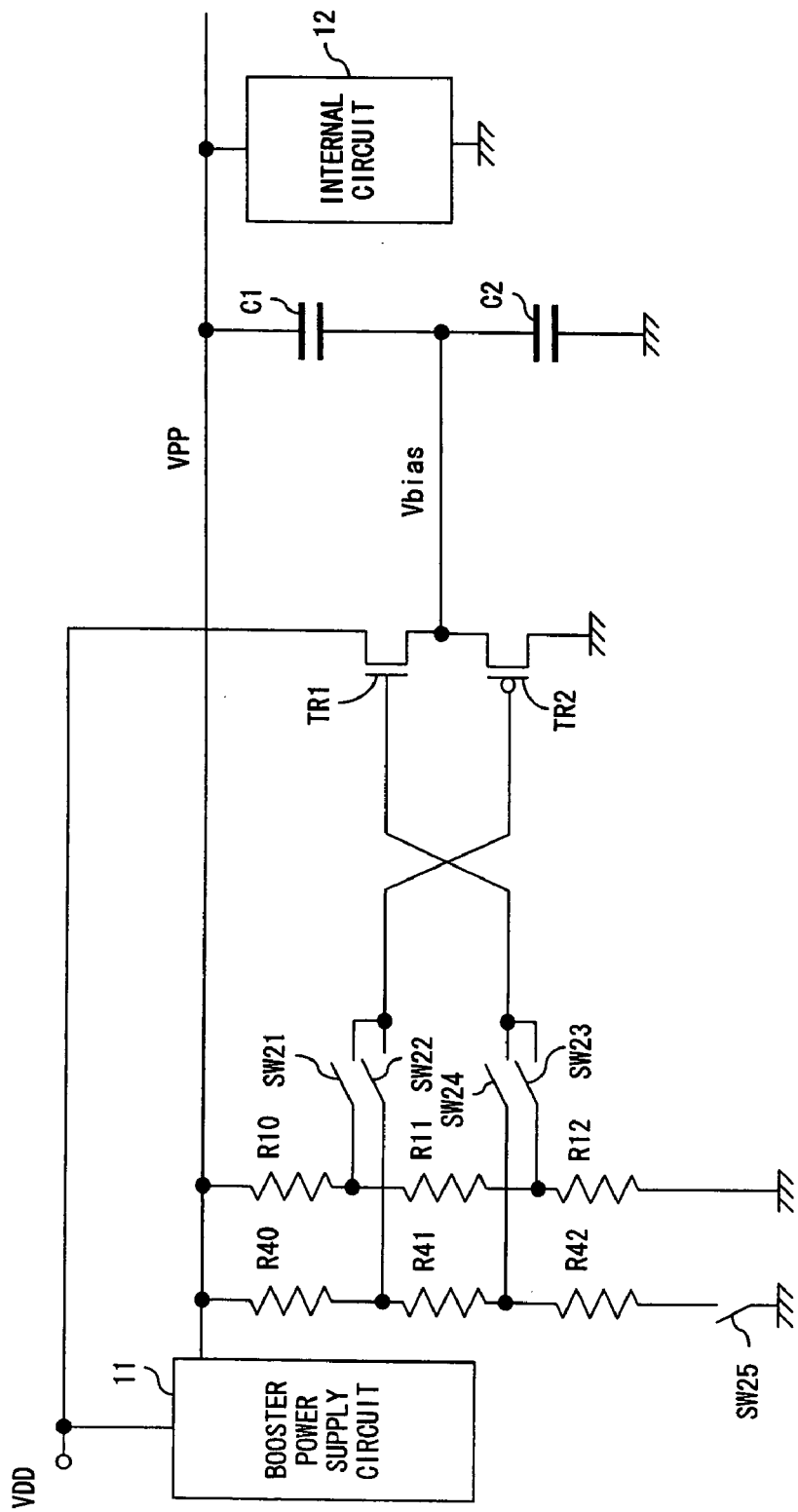
FIG. 12 is a circuit diagram showing a main portion of a midpoint potential generating circuit according to a fourth embodiment of the present invention.

FIG. 12 is a circuit diagram showing a midpoint potential generating circuit according to a fourth embodiment of the present invention.

In the fourth embodiment, reference resistors for determining the midpoint potential of the capacitors are switched over between the start time and the normal operation time.

In FIG. 12, the resistors R10, R11 and R12 and resistors R40, R41 and R42 are connected in series between the supply voltage VPP and the ground, respectively.

The node of the resistors R10 and R11 is connected to the gate of the MOS transistor TR1 through a switch SW21. Likewise, the node of the resistors R40 and R41 is connected to the gate of the MOS transistor TR2 through a switch SW22. The switches SW21 and SW22 may be made up of one switch with two contacts.

Also, the node of the resistors R11 and R12 is connected to the gate of the MOS transistor TR1 through a switch SW23. Likewise, the node of the resistors R41 and R42 is connected to the gate of the MOS transistor TR1 through a switch SW24. The switches SW23 and SW24 may also be made up of one switch with two contacts.

The resistances of the resistors R40, R41 and R42 are set to be smaller than the resistances of the resistors R10, R11 and R12 to reduce a time constant, and a design is made such that the rising gradients of the potentials of the node of the resistors R40 and R41 and the node of the resistors R41 and R42 become rapid.

The above switches SW21 to SW24 are made up of, for example, transfer gates. When the supply voltage is lower than a predetermined voltage, a gate voltage that makes the switches SW22 and SW24 turn on and the switches SW21 and SW23 turn off, respectively, is applied to the transfer gates.

Now, the operation of the circuit shown in FIG. 12 when the supply voltage VDD increases from 0V will be described.

When the supply voltage VDD is lower than the predetermined voltage, a signal that allows the switches SW22 and SW24 to turn on and the switches SW21 and SW23 to turn off is outputted from the same circuit as the bias controller circuit shown in FIG. 5. As a result, the voltage Vrefh that is determined by a ratio of the resistor R40 to the series combined resistor consisting of the resistors R41 and R42 is applied to the gate of the MOS transistor TR2. Also, the voltage Vrefl that is determined by a ratio of the series combined resistor consisting of the resistors R40 and R41 to the resistor R42 is applied to the gate of the MOS transistor TR1.

In this case, since the resistances of the resistors R40, R41 and R42 are set to be smaller than the resistances of the resistors R10, R11 and R12, the gradient of the voltage rising curve of the node of the resistors R40 and R41 is substantially identical with or larger than the gradient of the bias voltage Vbias rising curve of the node of the capacitors C1 and C2.

Accordingly, the voltage that is applied to the gates of the MOS transistors TR1 and TR2 at the starting time rises with substantially the same gradient as that of the bias voltage Vbias of the node of the capacitors C1 and C2. As a result, since the bias voltage Vbias of the node of the capacitors C1 and C2 becomes larger than the upper limit Vrefh of the reference voltage, there can be eliminated such a drawback that electric charges accumulated in the capacitor C2 are discharged.

Thereafter, when the supply voltage VDD becomes equal to or higher than the predetermined voltage, a signal that allows the switches SW21 and SW23 to turn on and the switches SW22 and SW24 to turn off is supplied. As a result, the voltage Vrefh that is determined by a ratio of the resistor R10 to the series combined resistor consisting of the resistors R11 and R12 is applied to the gate of the MOS transistor TR2. Also, the voltage Vrefl that is determined by a ratio of the series combined resistor consisting of the resistors R10 and R11 to the resistor R12 is applied to the gate of the MOS transistor TR1. The resistances during the normal operation are identical with those in the conventional circuit.

Figure 13:
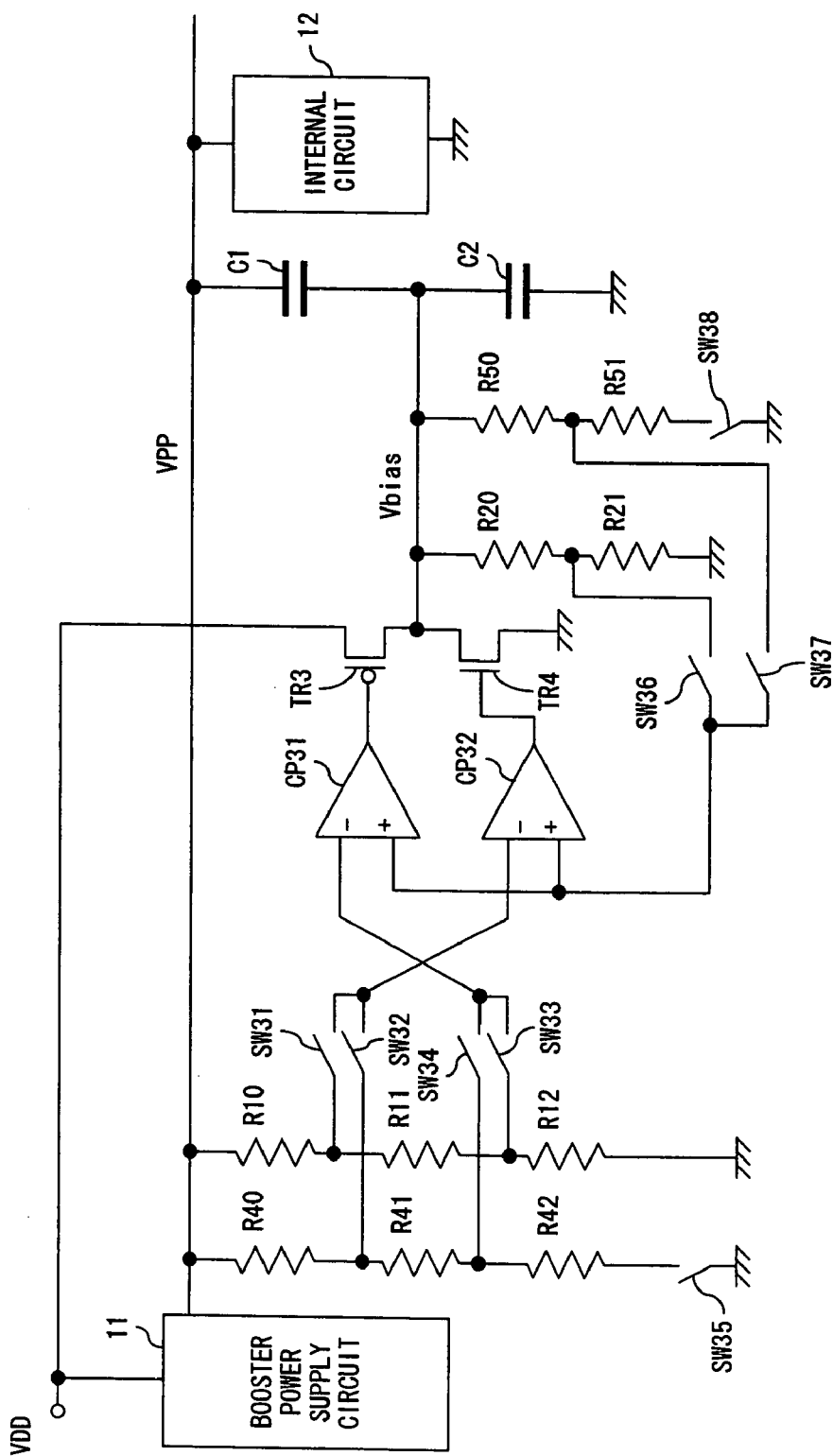
FIG. 13 is a circuit diagram showing a main portion of a midpoint potential generating circuit according to a fifth embodiment of the present invention.

FIG. 13 is a circuit diagram showing a midpoint potential generating circuit for used in a semiconductor device according to a fifth embodiment of the present invention.

Figure 2:
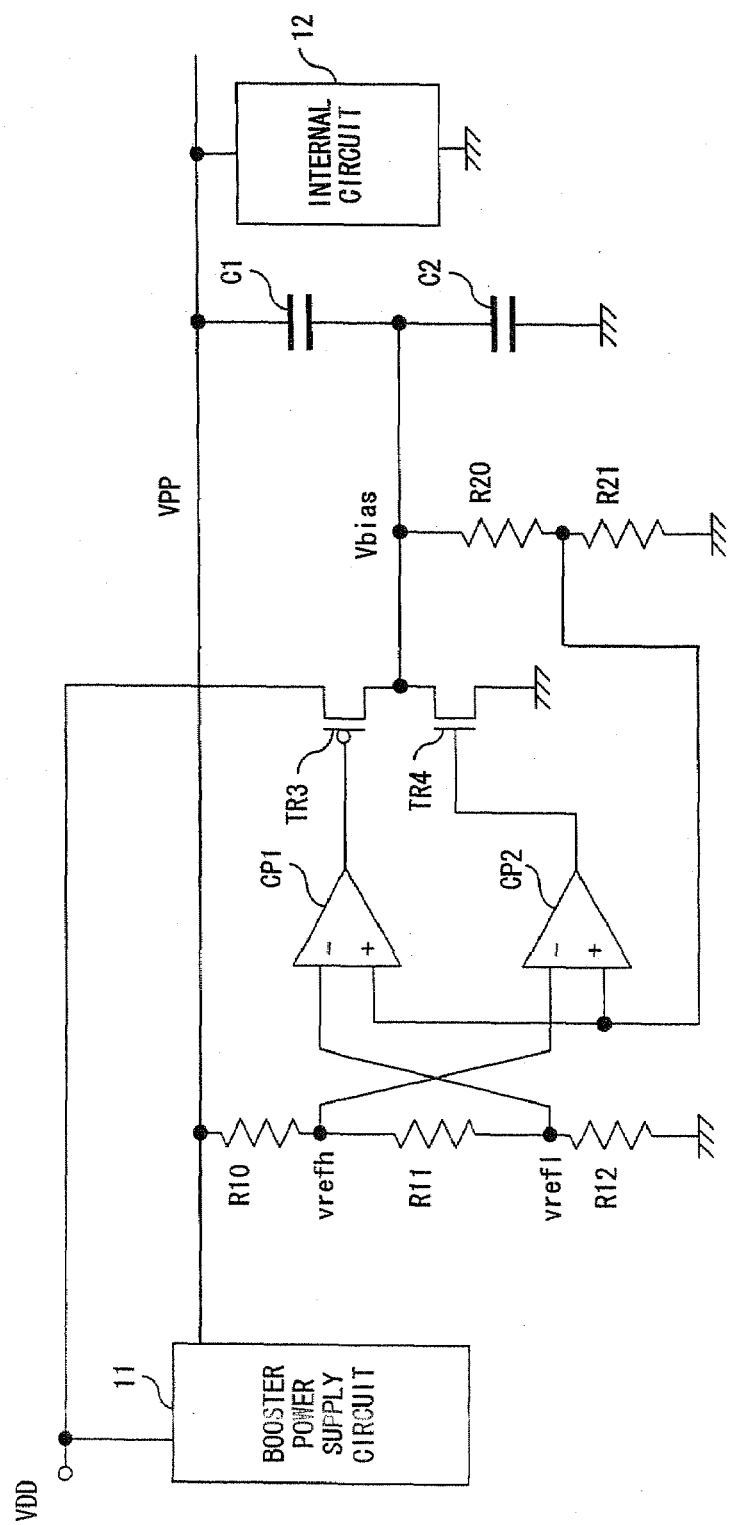
FIG. 2 is a circuit diagram showing another conventional midpoint potential generating circuit.
Figure 3:
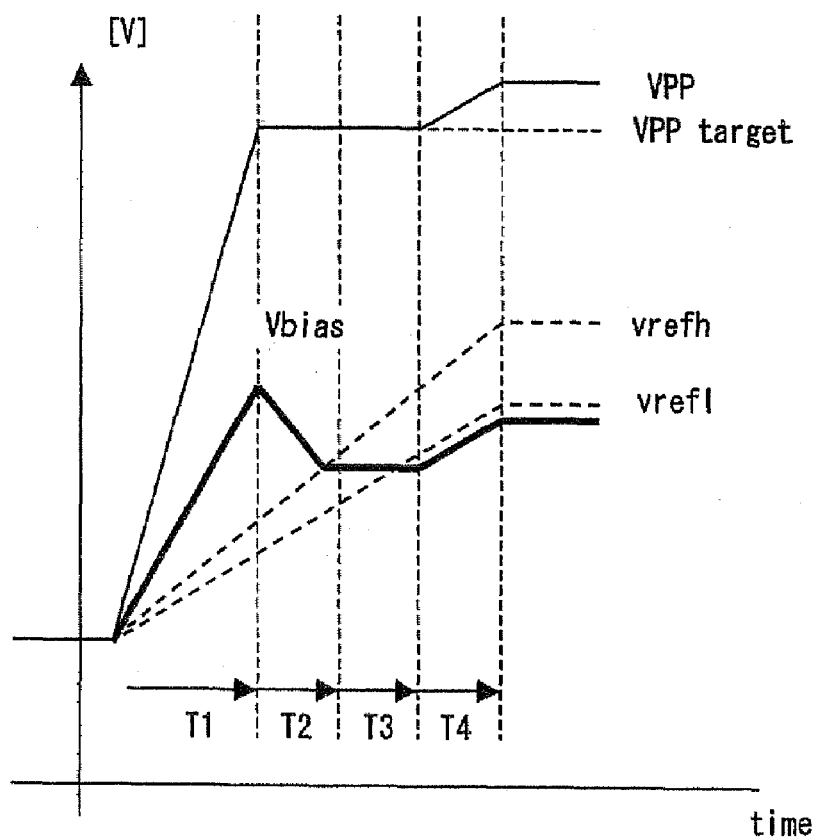
FIG. 3 is a timing chart of the conventional midpoint potential generating circuit.

In the fifth embodiment, a voltage obtained by dividing the bias voltage by resistors is compared with an upper limit and a lower limit of reference voltages that are determined by a resistance ratio of reference resistors by means of two comparators. In the following description, the same parts as those in the conventional circuit shown in FIG. 2 are designated by like references, and their description will be omitted.

In FIG. 13, the resistors R10, R11 and R12 and the resistors R40, R41 and R42 are connected in series between the supply voltage VPP and the ground, respectively.

The node of the resistors R10 and R11 is connected to an inverting input terminal of a comparator CP32 through a switch SW31. Likewise, the node of the resistors R40 and R41 is connected to an inverting input terminal of the comparator CP32 through a switch SW32.

The node of the resistors R11 and R12 is connected to an inverting input terminal of a comparator CP31 through a switch SW33. Likewise, the node of the resistors R41 and R42 is connected to an inverting input terminal of the comparator CP31 through a switch SW34.

One of a voltage obtained by dividing the bias voltage Vbias by the resistors R20 and R21 and a voltage obtained by dividing the bias voltage Vbias by resistors R50 and 51 is selected by switches SW36 and SW37, and then inputted to noninverting input terminals of the comparators CP31 and CP32. Also, a lower terminal of the resistor R51 is grounded through a switch SW38.

Now, the operation of the circuit shown in FIG. 13 when the supply voltage VDD increases from 0V will be described.

When the supply voltage VDD is lower than the predetermined voltage at the time of starting the power supply, a signal that allows the switches SW32 and SW34 to turn on and the switches SW31 and SW33 to turn off is outputted from the same circuit as the bias controller circuit shown in FIG. 5. Also, a signal that allows the switches SW36 to turn off and the switches SW37 and SW38 to turn on is outputted therefrom.

As a result, in the comparator CP32, a voltage that is determined according to the supply voltage VPP and a ratio of the resistor R40 to the series combined resistor consisting of the resistors R41 and R42 is compared with a voltage obtained by dividing the bias voltage Vbias by the resistors R50 and R51. On the basis of the comparison result, the output voltage is controlled so that the bias voltage Vbias becomes equal to or lower than the upper limit. Also, in the comparator CP31, a voltage that is determined according to the supply voltage VPP and a ratio of the series combined resistor consisting of the resistors R40 and R41 to the resistor R42 is compared with a voltage obtained by dividing the bias voltage Vbias by the resistors R50 and R51. The bias voltage Vbias is controlled so that the voltage divided by the resistors R50 and R51 falls within a range between the lower limit and the upper limit.

In this case, the resistances of the resistors R40, R41, R42, R50, and R51 are set to be smaller than the resistances of the resistors R10, R11, R12, R20 and R21. As a result, the gradient of the voltage rising curve of the node of the resistors R40 and R41 is substantially identical with or larger than the gradient of the bias voltage Vbias rising curve of the node of the capacitors C1 and C2. Similarly, the gradient of the voltage rising curve of the node of the resistors R50 and R51 is larger than the gradient of the voltage rising curve of the node of the resistors R20 and R21.

Accordingly, the gradient of the reference voltage rising curve of the inverting input terminals of the comparators CP31 and CP32 is set to be not smaller than the gradient of the rising curve of the voltage obtained by dividing the bias voltage Vbias by the resistors at the starting time. With this structure, there can be eliminated such a disadvantage that at the time of turning on the power supply, the bias voltage Vbias becomes equal to or higher than the reference voltage, and the electric charges accumulated in the capacitor C2 are discharged.

Thereafter, when the supply voltage VDD becomes equal to higher than the predetermined voltage, the switches SW31 and SW33 turn on, the switches SW32 and SW34 turn off, the switch SW36 turns on, and the switches SW37 and SW38 turn off. As a result, a voltage that is determined according to the ratio of the resistor R10 to the series combined resistor consisting of the resistors R20 and R21 is applied to the inverting input terminal of the comparator CP32, and a voltage that is determined according to the resistance ratio of the resistor R20 to the resistor R21 is applied to the noninverting input terminal of the comparator CP32. Similarly, the voltage that is determined according to the ratio of the series combined resistor consisting of the resistors R10 and the resistor R11 to the resistor R12, and a voltage that is determined according to the resistance ratio of the resistor R20 to the resistor R21 are applied to the comparator CP31.

In the above-mentioned fifth embodiment, two kinds of resistors R50, R51 and resistors R20, R21 are switched over in order to divide the voltage of the node of the capacitors C1 and C2. Otherwise, the resistors may not be switched over, and only the resistors R20 and R21 higher in the resistance may be used. Also, the switches SW31, SW32, the switches SW33, SW34, and the switches SW36, SW37 may be constituted by one switch, respectively.

FIG. 14 is a circuit diagram showing a midpoint potential generating circuit according to a sixth embodiment of the present invention. In the sixth embodiment, instead of the voltage divided by the resistors R40, R41 and R42 in the fourth embodiment, the supply voltage VDD or the grounding voltage VSS is applied to the gates of the MOS transistors TR1 and TR2.

In FIG. 14, the resistors R10, R11 and R12 are connected in series between the supply voltage VPP and the ground.

The node of the resistors R10 and R11 is connected to the gate of the MOS transistor TR2 through the switch SW21. Also, the gate of the MOS transistor TR2 is connected to the supply voltage VDD through the switch SW22. The switches SW21 and SW22 may be replaced by one switch with two contacts.

Also, the node of the resistors R11 and R12 is connected to the gate of the MOS transistor TR1 through the switch SW23. Also, the gate of the MOS transistor TR1 is grounded through the switch SW24. The switches SW23 and SW24 may be replaced by one switch with two contacts.

The above switches SW21 to SW24 are made up of, for example, transfer gates. When the supply voltage VDD is lower than a predetermined voltage, a gate voltage that makes the switches SW22 and SW24 turn on and the switches SW21 and SW23 turn off, respectively, is applied to the transfer gates.

Now, the operation of the circuit shown in FIG. 14 when the supply voltage VDD increases from 0V will be described.

When the supply voltage VDD is lower than the predetermined voltage, a signal that allows the switches SW22 and SW24 to turn on and the switches SW21 and SW23 to turn off is outputted from the same circuit as the bias controller circuit 21 shown in FIG. 5. As a result, the supply voltage VDD is applied to the gate of the MOS transistor TR2. Also, the grounding voltage VSS is applied to the gate of the MOS transistor TR1.

In this example, since the MOS transistors TR1 and TR2 become off at the starting time, there can be eliminated such a disadvantage that the electric charges accumulated in the capacitor C2 are discharged.

Thereafter, when the supply voltage VDD becomes equal to or higher than the predetermined voltage, a signal that allows the switches SW21 and SW23 to turn on and the switches SW22 and SW24 to turn off is supplied. As a result, the voltage Vrefh that is determined by a ratio of the resistor R10 to the series combined resistor consisting of the resistors R11 and R12 is applied to the gate of the MOS transistor TR2. Also, the voltage Vrefl that is determined by a ratio of the series combined resistor consisting of the resistors R10 and R11 to the resistor R12 is applied to the gate of the MOS transistor TR1. The resistances during the normal operation are identical with those in the conventional circuit.

In the above-mentioned sixth embodiment, the switches SW21, SW22, and the switches SW23, SW24 are switched over. Otherwise, only the switches SW21 and SW22 may be used, and only the supply voltage VDD may be applied to the gate of the MOS transistor.

Figure 15:
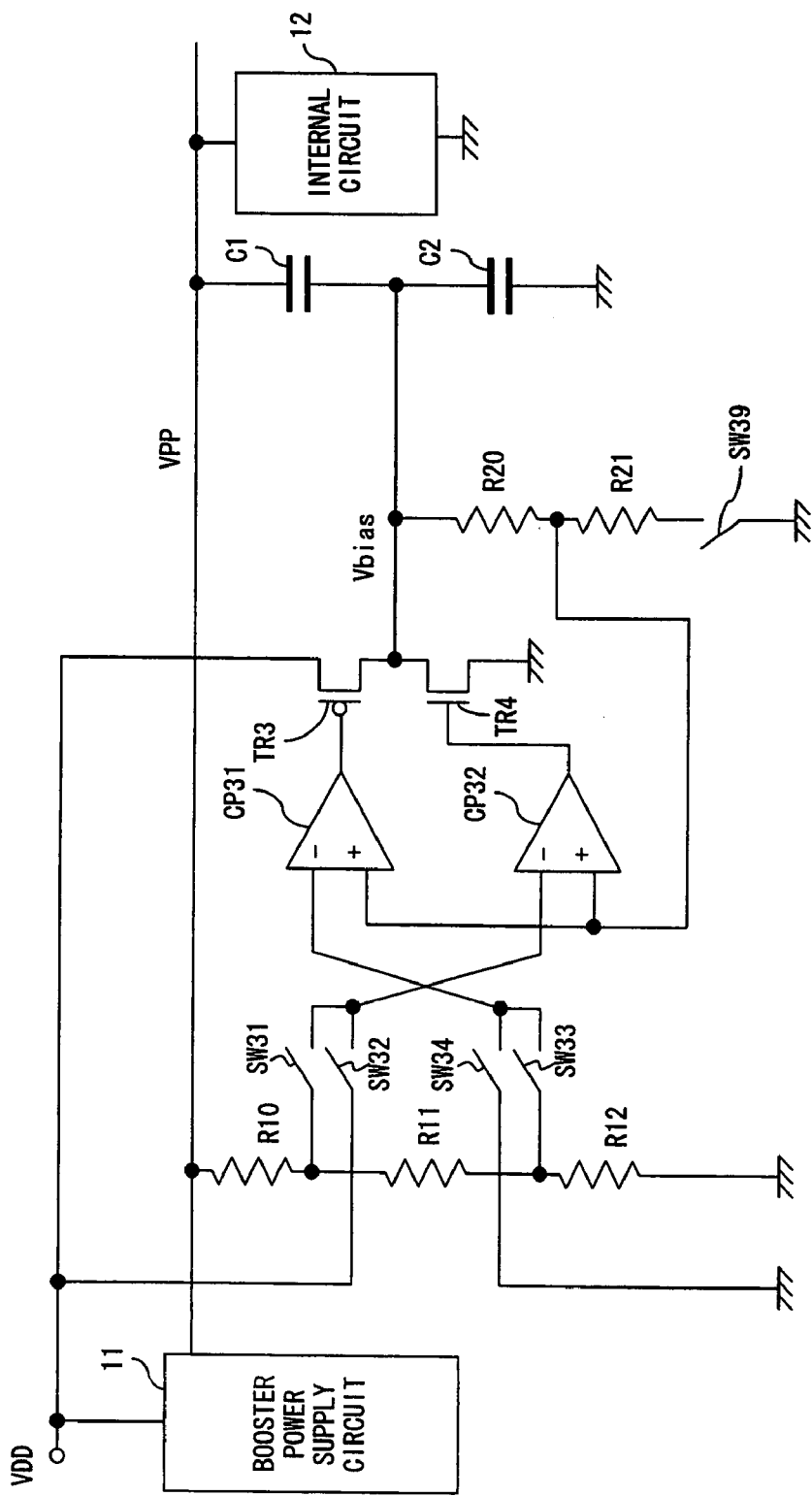
FIG. 15 is a circuit diagram showing a main portion of a midpoint potential generating circuit according to a seventh embodiment of the present invention.

FIG. 15 is a circuit diagram showing a midpoint potential generating circuit according to a seventh embodiment of the present invention. In the seventh embodiment, instead of the voltage divided by the resistors R40, R41 and R42 in the fifth embodiment, the supply voltage VDD or the grounding voltage VSS is applied to the gates of the MOS transistors TR1 and TR2. In the following description, the same parts as those in the conventional circuit shown in FIG. 2 and in the circuit shown in FIG. 13 are designated by like references, and their description will be omitted.

In FIG. 15, the resistors R10, R11 and R12 are connected in series between the supply voltage VPP and the ground.

The voltage of the node of the resistors R10 and R11 is inputted to the inverting input terminal of the comparator CP32 through the switch SW31, and the supply voltage VDD is also inputted to the inverting input terminal of the comparator CP32 through the switch SW32.

The voltage of the node of the resistors R11 and R12 is inputted to the inverting input terminal of the comparator CP31 through the switch SW33, and the grounding potential VSS is also inputted to the inverting input terminal of the comparator CP31 through the switch SW34.

A voltage obtained by dividing the bias voltage Vbias by the resistors R20 and R21 is inputted to the noninverting input terminals of the comparators CP31 and CP32. The resistor R21 has one end thereof connected to the ground through a switch SW39.

Now, the operation of the circuit shown in FIG. 15 when the supply voltage VDD increases from 0V will be described.

When the supply voltage VDD is lower than the predetermined voltage at the time of turning on the power supply, a signal that allows the switches SW32 and SW34 to turn on and the switches SW31 and SW33 to turn off is outputted from the same circuit as the bias controller circuit 21 shown in FIG. 5. Also, a signal that allows the switch SW39 to turn off is outputted.

As a result, in the comparator CP32, the supply voltage VDD is compared with the bias voltage Vbias. Since the bias voltage Vbias does not normally exceed the supply voltage VDD, the transistor TR4 turns off under the control. Similarly, in the comparator CP31, the grounding voltage VSS is compared with the bias voltage Vbias, and the transistor TR3 always turns off under the control.

Accordingly, there can be eliminated such a disadvantage that at the time of turning on the power supply, the bias voltage Vbias becomes equal to or higher than the reference voltage, and the electric charges accumulated in the capacitor C2 are discharged.

Thereafter, when the supply voltage VDD becomes equal to or higher than the predetermined voltage, the switches SW31 and SW33 turn on, the switches SW32 and SW34 turn off, and the switch SW39 turns on. As a result, the voltage that is determined by a ratio of the resistor R10 to the series combined resistor consisting of the resistors R11 and R12 is applied to the inverting input terminal of the comparator CP32. Also, the voltage that is determined by a resistance ratio of the resistors R20 and R21 is applied to the noninverting input terminal of the comparator CP32. Likewise, the voltage that is determined by a ratio of the series combined resistor consisting of the resistors R10 and R11 the resistor R12 and the voltage that is determined by the resistance ratio of the resistors R20 and R21 are applied to the comparator CP31.

In the above-mentioned seventh embodiment, the switches SW31, SW32, and the switches SW33, SW34 are switched over. Otherwise, only the switches SW31 and SW32 may be used, and only the supply voltage VDD may be applied to the gate of the MOS transistor.

According to the above-mentioned embodiments, the midpoint potential of the capacitors can be controlled to an appropriate value since the supply voltage rises until the supply voltage is stabilized. Also, the booster power supply circuit is started when the midpoint potential of the capacitors reaches the second predetermined reference voltage. With this structure, the power consumption can be prevented from increasing by operating the booster power supply circuit when the supply voltage of the semiconductor device is low.

The present invention is not limited to the above embodiments, but may be constituted as follows:

A circuit that generates the midpoint potential of the capacitors connected in series is not limited to the circuits shown in the above embodiments, but other known circuits can be employed.

The midpoint potential generating circuit according to the present invention is not limited to the circuit using the MOS transistors, but can be applied to a circuit using bipolar transistors.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A midpoint potential generating circuit for use in a semiconductor device, comprising:
a booster power supply circuit that boosts a first supply voltage into a second supply voltage and supplies the second supply voltage to an internal circuit of the semiconductor device;
at least two first and second capacitors that are connected in series;
a first voltage dividing resistor circuit that divides the second supply voltage outputted from the booster power supply circuit to generate two voltages of an upper limit and a lower limit;
a second voltage dividing resistor circuit that is smaller in resistance than the first voltage dividing resistor circuit and divides the second supply voltage outputted from the booster power supply circuit to generate two voltages of the upper limit and the lower limit; and
a bias supply circuit that controls a bias voltage that is supplied to the node between the first and second capacitors on the basis of the two voltage of the upper limit and the lower limit which are outputted from the second voltage dividing resistor circuit when the first supply voltage is lower than the predetermined value, and controls the bias voltage that is supplied to the node between the first and second capacitors on the basis of the two voltage of the upper limit and the lower limit which are outputted from the first voltage dividing resistor circuit when the first supply voltage is equal to or higher than the predetermined value.

2. A midpoint potential generating circuit for use in a semiconductor device, comprising:
a booster power supply circuit that boosts a first supply voltage into a second supply voltage and supplies the second supply voltage to an internal circuit of the semiconductor device;
at least two first and second capacitors that are connected in series;
a first voltage dividing resistor circuit that divides the second supply voltage outputted from the booster power supply circuit to generate two voltages of an upper limit and a lower limit;
a second voltage dividing resistor circuit that is smaller in resistance than the first voltage dividing resistor circuit and divides the second supply voltage outputted from the booster power supply circuit to generate two voltages of the upper limit and the lower limit;

a third voltage dividing resistor circuit that outputs a voltage obtained by dividing the midpoint potential of the first and second capacitors; and a bias voltage generating circuit that compares the upper limit and the lower limit which are outputted from the second voltage dividing resistor circuit with the voltage divided by the third voltage dividing resistor circuit, and controls a bias voltage that is supplied to the node between the first and second capacitors on the basis of the comparison result when the first supply voltage is lower than the predetermined value, and compares the upper limit and the lower limit which are outputted from the first voltage dividing resistor circuit with the voltage divided by the third voltage dividing resistor circuit, and controls a bias voltage that is supplied to the node between the first and second capacitors on the basis of the comparison result when the first supply voltage is equal to or higher than the predetermined value.

3. The midpoint potential generating circuit for use in a semiconductor device according to claim 1, wherein the bias voltage generating circuit comprises:

first switch unit for selecting and outputting the upper value of the voltage that is outputted from the second voltage dividing resistor circuit when the first supply voltage is lower than the predetermined value, and selecting and outputting the upper value of the voltage that is outputted from the first voltage dividing resistor circuit when the first supply voltage is equal to or higher than the predetermined value;

second switch unit for selecting and outputting the lower value of the voltage that is outputted from the second voltage dividing resistor circuit when the first supply voltage is lower than the predetermined value, and selecting and outputting the lower value of the voltage that is outputted from the first voltage dividing resistor circuit when the first supply voltage is equal to or higher than the predetermined value;

a first comparator circuit that compares the upper limit selected by the first switch unit with the output voltage of the third voltage dividing resistor circuit;

a second comparator circuit that compares the lower limit selected by the second switch unit with the output voltage of the third voltage dividing resistor circuit; and a MOS transistor that controls the gate voltage on the basis of the comparison results of the first and second comparator circuits, and supplies a voltage corresponding to the gate voltage to the node between the first and second capacitors as the midpoint potential.

* * * * *